United States Patent [19]

Vogel et al.

[11] Patent Number: 5,369,283
[45] Date of Patent: Nov. 29, 1994

[54] HIGH-VOLTAGE SWITCH HAVING SERIES-CONNECTED LIGHT-RESPONSIVE SEMICONDUCTOR ELEMENTS AND LIGHT CONCENTRATING MEANS FOR THE SEMICONDUCTOR ELEMENTS

[75] Inventors: Manfred Vogel, Ditzingen-Heimerdingen; Werner Herden, Gerlingen; Johann Konrad, Tamm, all of Germany

[73] Assignee: Robert Bosch GmbH, Stuttgart, Germany

[21] Appl. No.: 971,752

[22] PCT Filed: Sep. 6, 1991

[86] PCT No.: PCT/DE91/00711

§ 371 Date: Jan. 26, 1993

§ 102(e) Date: Jan. 26, 1993

[87] PCT Pub. No.: WO92/07188

PCT Pub. Date: Mar. 30, 1992

[30] Foreign Application Priority Data

Oct. 10, 1990 [DE] Germany .................. 4032131

[51] Int. Cl.⁵ ............................................. G02B 27/00
[52] U.S. Cl. ..................................... 250/551; 327/514
[58] Field of Search ............ 250/551, 214.1, 214.5 W; 307/311; 257/432, 436

[56] References Cited

U.S. PATENT DOCUMENTS

| | | |
|---|---|---|
| 4,577,114 | 3/1986 | Levy et al. |
| 4,695,733 | 9/1987 | Pesavento. |
| 4,899,204 | 2/1990 | Rosen et al. ............... 250/551 |
| 4,900,947 | 2/1990 | Weiner et al. ............ 250/551 |
| 5,047,623 | 9/1991 | Wilcox ...................... 250/551 |
| 5,155,352 | 10/1992 | Kim et al. ................. 250/551 |

FOREIGN PATENT DOCUMENTS 8900645 1/1989 WIPO.

Primary Examiner—David C. Nelms
Attorney, Agent, or Firm—Michael J. Striker

[57] ABSTRACT

A high-voltage switch (18) with light sensitive zones is described which transmits the high voltage to the spark plugs. In order to transmit the light energy with the minimum possible loss from the light emitting element (20) to the light sensitive zones of the high-voltage switch (18), a light concentrating device is provided in a transition region from the light emitting element to the light sensitive zone. The light concentrating device can be a glass rod which acts as a lens or a light guide including optical fibers.

19 Claims, 3 Drawing Sheets

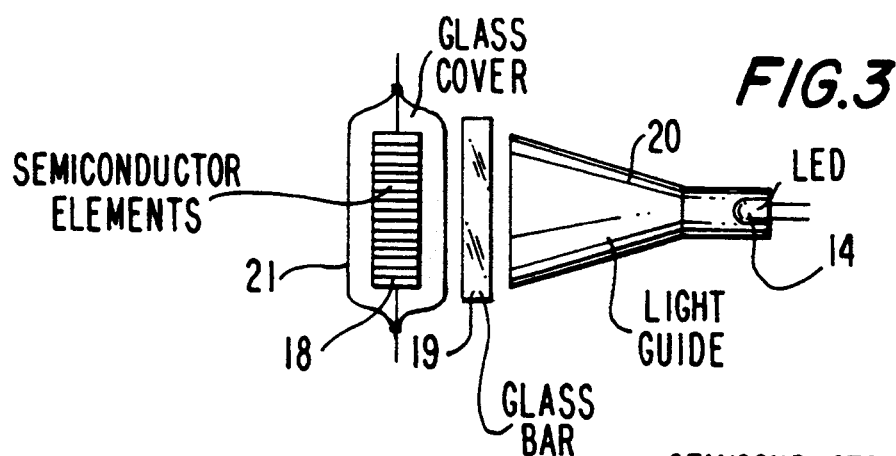
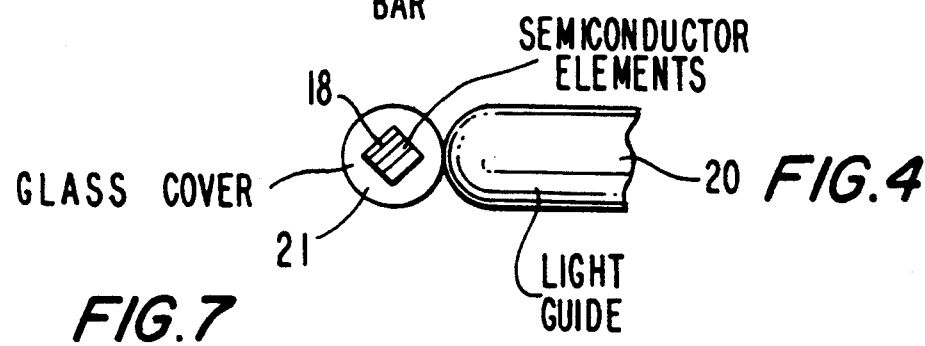
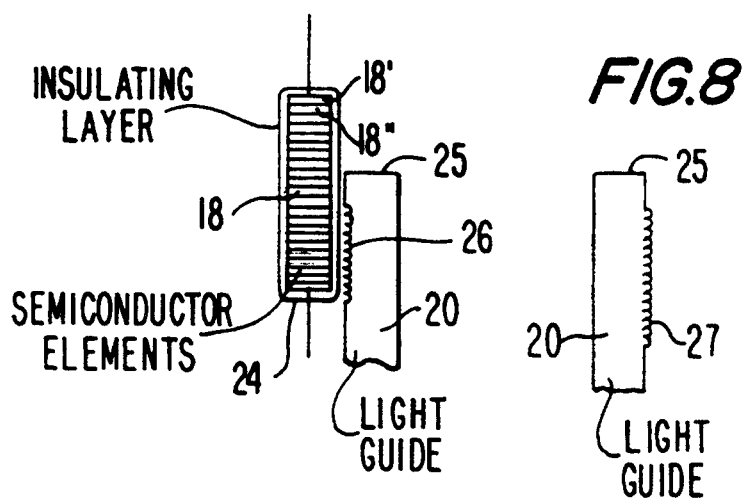
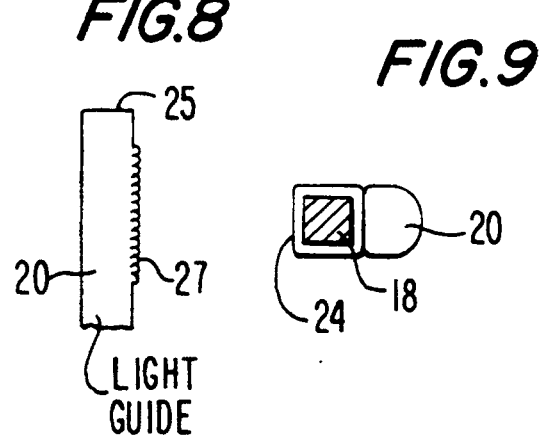
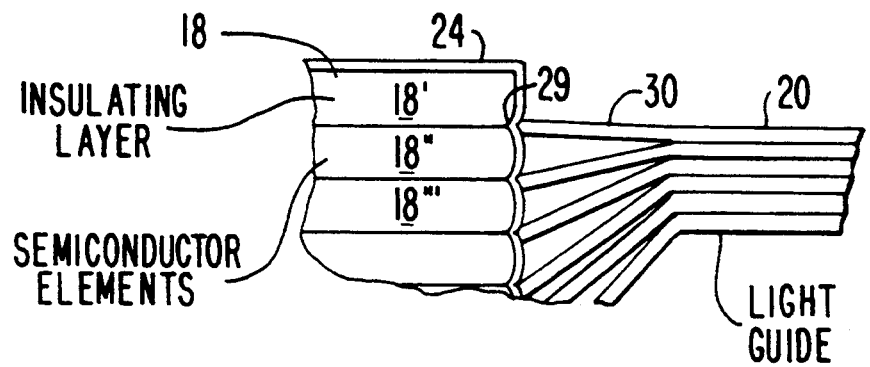

HIGH-VOLTAGE SWITCH HAVING SERIES-CONNECTED LIGHT-RESPONSIVE SEMICONDUCTOR ELEMENTS AND LIGHT CONCENTRATING MEANS FOR THE SEMICONDUCTOR ELEMENTS

BACKGROUND OF THE INVENTION

The present invention relates to a high-voltage switch and, more particularly, to a high-voltage switch for an ignition voltage distributor of an internal combustion engine.

A high-voltage switch is known consisting of a plurality of series-connected semiconductor elements, especially sweep diodes in cascade connection, coated with a translucent insulation. When a predetermined voltage is applied the high-voltage switch suddenly switches to a conductive state in such a way that on irradiation of the light sensitive zones of the semiconductor elements by a light emitting element, the high voltage switch switches. From EP 0 377 619, a high-voltage switch is known, which operates as an ignition voltage distributor under static high-voltage distribution. This high-voltage switch comprises semiconductor elements which have light sensitive zones. The light sensitive zones can be driven by light emitting elements so that they switch at a predetermined time, corresponding to the ignition sequence, for example. In the known arrangements, light guides or light diodes are arranged opposite the light sensitive zones of the high-voltage switch. The disadvantage in this arrangement is that a portion of the light energy is lost to the environment, whereby the functional reliability of the high-voltage switch is impaired.

SUMMARY OF THE INVENTION

It is an object of the present invention to provide a high-voltage switch, particularly for an ignition voltage distributor of an internal combustion engine, which does not have the above-described disadvantage.

This object, and others which will be made more apparent hereinafter, is attained in a high-voltage switch consisting of a plurality of series-connected semiconductor elements, especially sweep diodes in cascade connection, coated with a translucent insulator, structured so that, when a predetermined voltage is applied the high-voltage switch suddenly switches to a conductive state, in such a way that on irradiation of the light sensitive zones of the semiconductor elements by a light emitting element, the high voltage switch switches.

According to the invention the high-voltage switch has light concentrating means for transmitting light energy from the light emitting element to the light sensitive zones with minimum los of light energy.

In contrast, the arrangement in accordance with the invention has the advantage that the light energy is transmitted with little loss by virtue of a "light bundle" design of the transition between the light emitting element and the light sensitive zone of the high-voltage switch, and that the functional reliability is improved.

The light concentrating means can be a structural element having an optical lens effect arranged between the light emitting means and the light sensitive zones of the semiconductor elements. However a glass cover can also be provided on the semiconductor elements for concentrating the light. The semiconductor elements can be arranged in a reflector which acts as the light concentrating means, or, a metallized light guide piece can be arranged next to the semiconductor elements to transmit the light energy to the semiconductor elements. Finally, a thin transparent insulating layer can be provided on the semiconductor elements, the light guide can be arranged next to the semiconductor elements and can be specially designed with notches or nodules adjacent the light sensitive zones. It is also advantageous to irradiate only a portion of the semiconductor elements with light so that only a portion of the semiconductor elements are switched and the remainder are switched when a definite breakdown voltage is reached.

BRIEF DESCRIPTION OF THE DRAWING

The objects, features and advantages of the present invention will now be illustrated in more detail by the following detailed description, reference being made to the accompanying drawing in which:

FIG. 3 is a front view of the transitional region shown in FIG. 2;

FIG. 4 is a detailed cross-sectional view through a high-voltage switch according to the invention and having a glass cover acting as a light focusing means;

FIG. 7 is a plan view of a group of connected semiconductor elements with an associated light guide having a thin insulating layer with notches according to the invention;

FIG. 8 is a plan view of a light guide having nodules according to the invention;

FIG. 9 is a cross-sectional view of a connected stack of semiconductor elements having a thin insulating layer and a light guide contacting the semiconductor elements with a flattened portion;

FIG. 11 is a plan view of an additional embodiment with a light guide having a plurality of individual light guide fibers.

DESCRIPTION OF THE PREFERRED EMBODIMENTS

Figure 1:
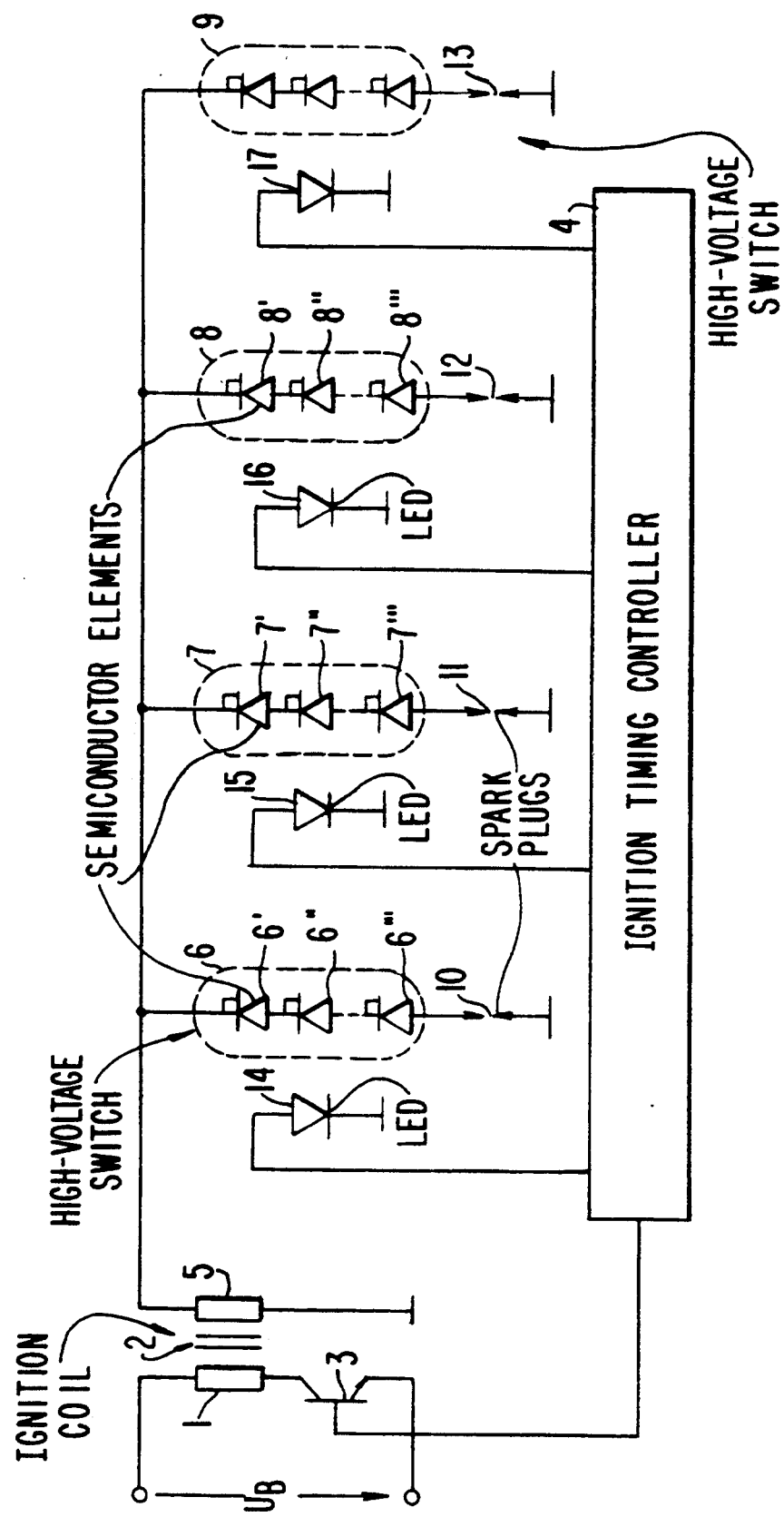
FIG. 1 is an ignition circuit diagram of an ignition circuit having high-voltage switches according to the invention.

FIG. 1 shows a ignition voltage distributing apparatus for the distribution of the ignition voltage. A battery voltage UB is applied to the primary winding 1 of an ignition coil 2, with a switching transistor 3 connected in series with the primary winding 1. The switching transistor 3 is continuously operated by an ignition timing controller 4 via its base connection, for the generation of a high voltage in the secondary winding 5 of the ignition coil. One side of the secondary winding 5 of the ignition coil 2 is connected to ground, and the other side is connected to the spark plugs 10 to 13 via their high-voltage switches, 6, 14; 7, 15; 8, 16; and 9, 13. Each of the high-voltage switches 6, 14; 7, 15; 8, 16; and 9, 17 consist of a light emitting element 14, 15, 16, 17 positioned adjacent to a plurality 6, 7, 8 and 9 of semiconductor elements or chips connected in series with each other and having light sensitive zones. For example group 6 of the semiconductor elements consists of sweep diode 6', 6", , , 6" ∝ stacked on top of each other. In a similar manner the other groups of semiconductor elements consist of sweep diodes stacked on to of each other as shown in the drawing. The high-voltage switches 6 to 9 are driven as sweep diodes in cascade connection, in which a cascade consists of 30 to 50 chips, so that approximately a 40 kV blocking voltage is ensured in their light sensitive regions, by light emitting sources, 14 to 17, (e.g. light diodes) in accordance with the ignition sequence, and in this way transmit the ignition voltage to the spark plugs.

FIGS. 2 to 9 show light concentrating means for transmitting light energy from the light emitting elements to the light sensitive zones to ensure the minimum possible loss of light energy.

Figure 2:
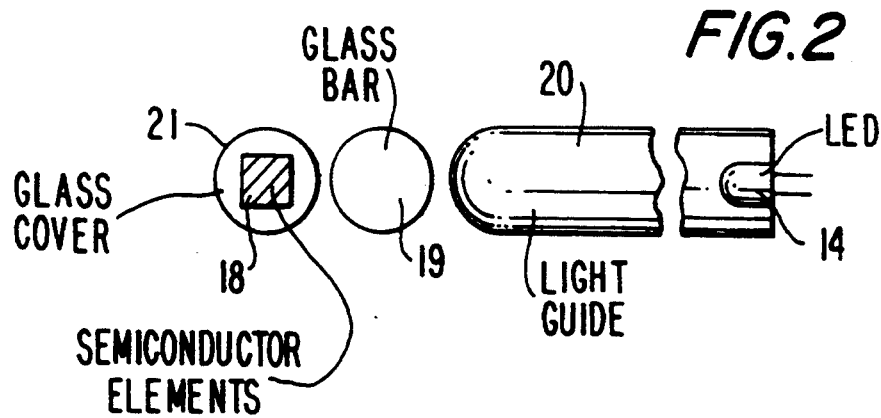
FIG. 2 is a cross-sectional view showing a transitional region in a high-voltage switch according to the invention between a light guide and semiconductor elements in which an additional glass bar lens is present.

FIG. 2 shows the cross-section of the series-connected semiconductor element 18, a glass bar 19, and a light guide 20. Due to the different refractive indices of air and glass and due to the circular cross-section of the glass bar, the glass bar 19 has a lens effect and concentrates the light rays of the LED 14 so that as much energy as possible impinges on the light sensitive zones of the semi-conductor elements 18. FIG. 3 shows the same design in front view. The light concentrating means in the embodiment of FIGS. 2 and 3 thus includes a glass bar 19.

FIG. 4 also shows a cross-section through the light sensitive zones of the semiconductor switch 18 and the associated light guide 20, albeit that no glass bar is used for bundling the light, but the thick glass cover 21 is used for focusing the light energy. At the same time, the multi-cornered semiconductor elements 18 is arranged so that as large a circumferential area of the semiconductor elements as possible, is irradiated with light energy.

Figure 5:
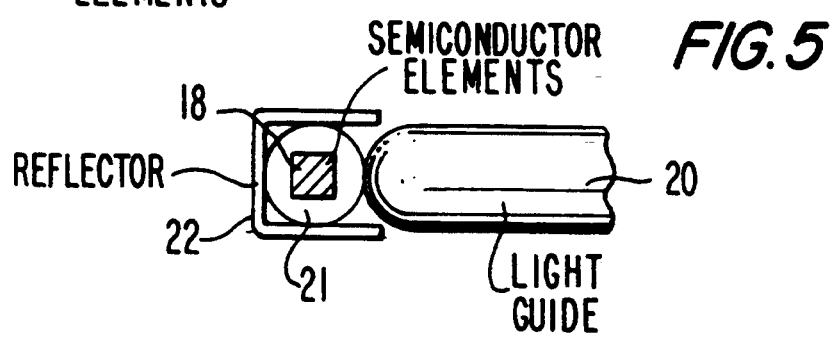
FIG. 5 is a cross-sectional view of another embodiment of a high-voltage switch according to the invention including a reflector for concentrating the light from the light emitting elements.

FIG. 5 shows a cross-section of the high-voltage switch with associated light guide 20, with the semiconductor elements 18 being arranged in a reflector 22. This refinement facilitates high efficiency of the light energy transmission to the light sensitive zones of the semiconductor elements 18, since due to the reflection, no light energy is lost.

Figure 6:
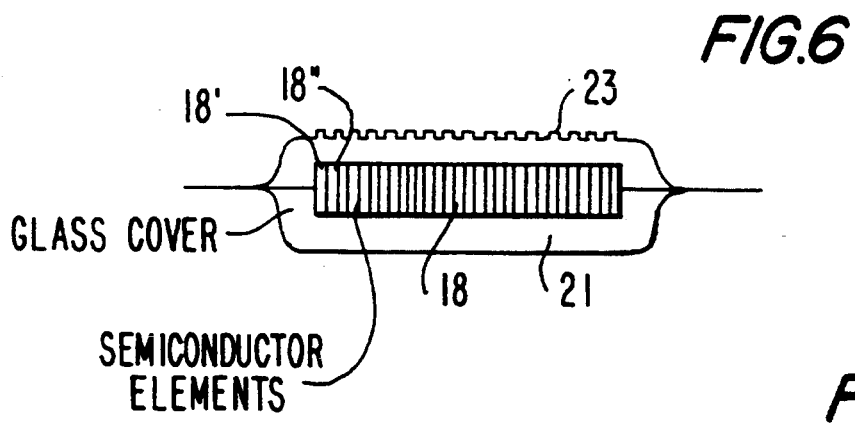
FIG. 6 is a cross-sectional view of another embodiment of a semiconductor element stack from a high-voltage switch according to the invention having a laser-treated glass cover.
Figure 10:
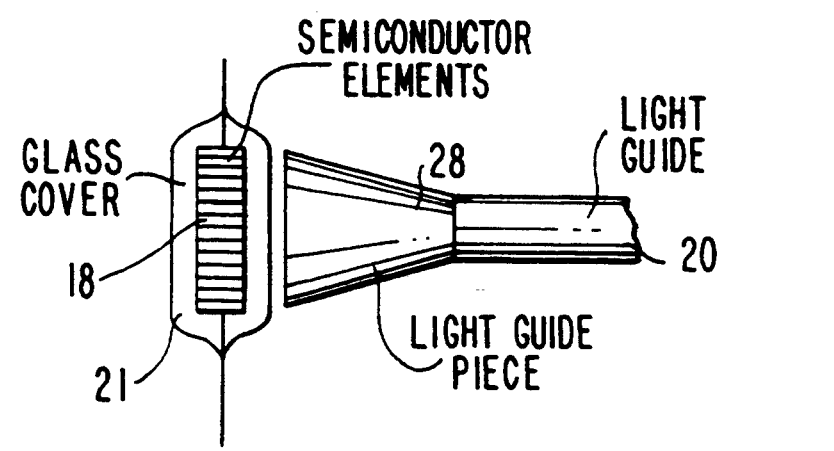
FIG. 10 is a plan view of another embodiment with a light guide.

FIG. 6 shows a semiconductor elements 18 with a thick glass cover 21, in which the glass cover surface has been treated by laser such that minor ridges 23 develop which have the effect of an optical lens.

FIGS. 7 to 9 show that, with a thin transparent insulating layer 24 on the semiconductor elements 18, the light guide 20 can also be designed for a low-loss transition of the light energy. In this embodiment the light guide 20 is arranged lengthwise on the high-voltage switch and is metallized at its end 25. i.e. no light energy can emerge from the end of the light guide 20.

FIG. 7 shows a light guide which has notches 26, with these notches covering only a portion of the semiconductor elements 8 and having a spacing which corresponds to the spacing of the light sensitive zones on the semiconductor elements. FIG. 8 shows a light guide with nodules 27, with the spacing of the nodules 27 corresponding to the spacing of the light sensitive zones. It is further possible to design the semiconductor elements 18 at its light sensitive zones, i.e. the pn junctions, such that the light emitting means 20 and the semiconductor elements can be assigned to each other by means of notches, preferably without any gap. Finally, the possible flattening of the light guide 20 shown in FIG. 9 semiconductor elements allows the light guide to rest against the semiconductor elements 18.

All light concentrating means in the transition region from the light emitting element to the light sensitive zone at the semiconductor elements, as shown in FIGS. 2 to 9, are used to transmit the light energy to the semiconductor elements with the minimum possible loss.

A further means of transmitting the light energy to the light sensitive zones of the high-voltage switch comprises a light guide piece 28 in accordance with FIG. 7. On one of its sides, this light guide piece has a circular cross-section to accommodate the light emitting element or the end of a light guide 20, and on the other side, it is matched to the shape of the high-voltage switch, for example, by virtue of a rectangular or linear area of emergence. The surface area of this light guide piece 28 can additionally be finished in white or metallized, so that by reflection on the surface area, an almost complete transmission of the light energy to the light sensitive zones is ensured.

Finally, it should be mentioned that a light guide 20 in accordance with an additional embodiment shown in FIG. 8 can be fanned out by many individual light guide fibers 30 such that individual light guide fibers can be assigned to each of the light sensitive zones of the semiconductor elements 18, which means that the originally circular cross-section of the light guide 20 is extended in a linear or a rectangular fashion.

In accordance with FIG. 8, these light guide fibers 30 can each be routed into a notch 29 at the light sensitive zones of the high-voltage switch so that a most favorable junction from the end of a light guide fiber 30 to a pn transition is formed.

The semiconductor elements 18 consist of a plurality of individual semiconductor elements 18', 18", 18"'. . . . stacked on top of each other in the preferred embodiment shown in the drawing.

While the invention has been illustrated and described as embodied in a high-voltage switch, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

What is claimed is:

1. High-voltage switch comprising
light emitting means for producing light energy,
a plurality of semiconductor elements connected electrically in series with each other, stacked on top of each other and having light sensitive zones, said semiconductor elements being positioned so that said light sensitive zones receive said light energy generated by said light emitting means, said semiconductor elements being structured to become conductive when receiving said light energy from said light emitting means and when a predetermined voltage is applied to said plurality of said semiconductor elements;

a transparent insulating layer coating said plurality of said semiconductor elements; and light concentrating means for concentrating said light energy from said light emitting means on the light sensitive zones of said semiconductor elements to minimize loss of said light energy.

2. High-voltage switch as defined in claim 1, wherein said semiconductor elements consist of sweep diodes in cascade connection.

3. High-voltage switch as defined in claim 1, wherein said light concentrating means includes at least one structural element positioned between the light emitting means and the light sensitive zones of said semiconductor elements, said structural element being designed to concentrate light energy on said light sensitive zones.

4. High-voltage switch as defined in claim 1, wherein said light concentrating means includes a thick round glass cover surrounding said semiconductor elements and said semiconductor elements have a multicornered cross-section so that said loss of said light energy is minimized by focussing said light energy on said semiconductor elements with said glass cover.

5. High-voltage switch as defined in claim 1, wherein said light concentrating means includes a reflector positioned adjacent said semiconductor elements to reflect said light energy onto said light sensitive zones of said semiconductor elements.

6. High-voltage switch as defined in claim 1, wherein said transparent insulating layer is a transparent insulating coating having a plurality of ridges providing a light-focussing effect.

7. High-voltage switch as defined in claim 1, wherein said transparent insulating layer includes means for point-like irradiation of the light sensitive zones with said light energy.

8. High-voltage switch as defined in claim 7, wherein the light concentrating means includes a light guide having a metallized free end and a plurality of notches and positioned adjacent said light sensitive zones so that said notches are adjacent said light sensitive zones.

9. High-voltage switch as defined in claim 7, wherein the light concentrating means includes a light guide having a metallized free end and a plurality of nodules and positioned adjacent said light sensitive regions so that said nodules are adjacent said light sensitive zones.

10. High-voltage switch as defined in claim 7, wherein the light concentrating means includes a light guide having a flattened portion and positioned adjacent said light sensitive zones so that said flattened portion is adjacent said light sensitive zones.

11. High-voltage switch as defined in claim 1, wherein said light concentrating means comprises a light guide means arranged between the light emitting means and the light sensitive zones of the semiconductor elements.

12. High-voltage switch as defined in claim 11, wherein said light concentrating means comprises a light guide means arranged between the light emitting element and the light sensitive regions of the semiconductor elements.

13. High-voltage switch as defined in claim 11, wherein said light guide means is provided with a metallized surface for collecting said light energy.

14. High-voltage switch as defined in claim 11, wherein said light guide means is provided with a white coating.

15. High-voltage switch as defined in claim 11, wherein said light guide means is provided with reflective surfaces for total reflection of said light energy.

16. High-voltage switch as defined in claim 15, wherein said light guide means comprises a plurality of optical fibers.

17. High-voltage switch as defined in claim 11, wherein said light guide means has a circular cross-section at an entrance in the vicinity of said light emitting means and a rectangular cross-section in the vicinity of an exit adjacent said semiconductor elements.

18. High-voltage switch as defined in claim 2, wherein said light emitting means and said light concentrating means are structured so that only an active portion of the light sensitive zones of said sweep diodes receive said light energy when said light energy is generated by said light emitting means so as to reduce a breakdown voltage of said plurality of said semiconducting elements and said sweep diodes switch when said reduced breakdown voltage is applied to said sweep diodes.

19. An ignition voltage distributor apparatus for an ignition voltage of an internal combustion engine comprising an ignition coil having a primary and a secondary coil in which a predetermined high-voltage is generated and a plurality of high-voltage switches connected in parallel with the secondary coil, each of said high-voltage switches comprising light emitting means for producing light energy, a plurality of semiconductor elements connected electrically in series with each other and having light sensitive zones, said semiconductor elements being positioned so that said light sensitive zones receive said light energy generated by the light emitting means, said semiconductor elements being structured to become conductive when receiving said light energy from the light emitting means and when under said predetermined high voltage; a transparent insulating layer coating said semiconductor elements and light concentrating means for transmitting said light energy from said light emitting elements to the light sensitive zones of said semiconductor elements to minimize loss of said light energy.

* * * * *